US012804834B2

(12) United States Patent
Oh et al.

(10) Patent No.: US 12,804,834 B2
(45) Date of Patent: Nov. 17, 2026

(54) DISPLAY DEVICE HAVING A BOTTOM COVER SYSTEM WHICH INCLUDES A BOTTOM COVER CONSTRUCTED FROM RECYCLED MATERIAL

(71) Applicant: Dell Products L.P., Round Rock, TX (US)

(72) Inventors: Guentaek Oh, Singapore (SG); Eun Seok Kim, Singapore (SG)

(73) Assignee: Dell Products L.P., Round Rock, TX (US)

( * ) Notice: Subject to any disclaimer, the term of this patent is extended or adjusted under 35 U.S.C. 154(b) by 152 days.

(21) Appl. No.: 18/680,286

(22) Filed: May 31, 2024

(65) Prior Publication Data

US 2025/0374461 A1 Dec. 4, 2025

(51) Int. Cl.
*H05K 5/03* (2006.01)
*H05K 5/02* (2006.01)

(52) U.S. Cl.
CPC ............ *H05K 5/03* (2013.01); *H05K 5/0217* (2013.01)

(58) Field of Classification Search
CPC .......................... H05K 5/0017; H05K 5/0217
USPC ........................................ 361/807, 809, 810
See application file for complete search history.

(56) References Cited

U.S. PATENT DOCUMENTS 8,610,842 B2 * 12/2013 Kim ...................... H04N 23/57 348/333.08
2014/0055976 A1 * 2/2014 Gu ..................... G02F 1/133308 361/809
2018/0356674 A1 * 12/2018 Son .................. G02F 1/133308
2021/0373380 A1 * 12/2021 Oh .................... G02F 1/133308
2022/0210931 A1 * 6/2022 Zhang .................. F16M 11/045
2023/0009971 A1 * 1/2023 Yoon .................... G09F 9/3026

OTHER PUBLICATIONS

List of Patents or Patent Applications Treated as Related, Nov. 2024.

* cited by examiner

*Primary Examiner* — Hung S. Bui
(74) *Attorney, Agent, or Firm* — Terrile, Cannatti & Chambers, LLP; Stephen A. Terrile

(57) ABSTRACT

A display device which includes a display component and a bottom cover system. The bottom cover system includes a bottom cover system frame, the bottom cover system frame being configured to extend substantially around a periphery of the display device; and bottom cover component, the bottom cover component being physically coupled to the bottom cover system frame via a bottom cover component fastening device, the bottom cover component having a rectangular bottom cover component area, the rectangular bottom cover area being less than an area of a rectangular area of the display device.

15 Claims, 17 Drawing Sheets

DISPLAY DEVICE HAVING A BOTTOM COVER SYSTEM WHICH INCLUDES A BOTTOM COVER CONSTRUCTED FROM RECYCLED MATERIAL

BACKGROUND OF THE INVENTION

Field of the Invention

The present invention relates to information handling systems. More specifically, embodiments of the invention relate to information handling system display devices.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

An information handling system display device which includes a bottom cover system which includes a bottom cover constructed from recycled material is disclosed.

More specifically, in one embodiment the invention relates to a bottom cover system for a display device comprising: a bottom cover system frame, the bottom cover system frame being configured to extend substantially around a periphery of the display device; and a bottom cover component, the bottom cover component being physically coupled to the bottom cover system frame via a bottom cover component fastening device, the bottom cover component having a rectangular bottom cover component area, the rectangular bottom cover area being less than an area of a rectangular area of the display device.

In another embodiment the invention relates to a display device comprising: a display component; and, a bottom cover system, the bottom cover system comprising a bottom cover system frame, the bottom cover system frame being configured to extend substantially around a periphery of the display device; and bottom cover component, the bottom cover component being physically coupled to the bottom cover system frame via a bottom cover component fastening device, the bottom cover component having a rectangular bottom cover component area, the rectangular bottom cover area being less than an area of a rectangular area of the display device.

In another embodiment the invention relates to a system comprising: a processor; a data bus coupled to the processor; and a display device, the display device comprising a display component; and, a bottom cover system, the bottom cover system comprising a bottom cover system frame, the bottom cover system frame being configured to extend substantially around a periphery of the display device; and bottom cover component, the bottom cover component being physically coupled to the bottom cover system frame via a bottom cover component fastening device, the bottom cover component having a rectangular bottom cover component area, the rectangular bottom cover area being less than an area of a rectangular area of the display device.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
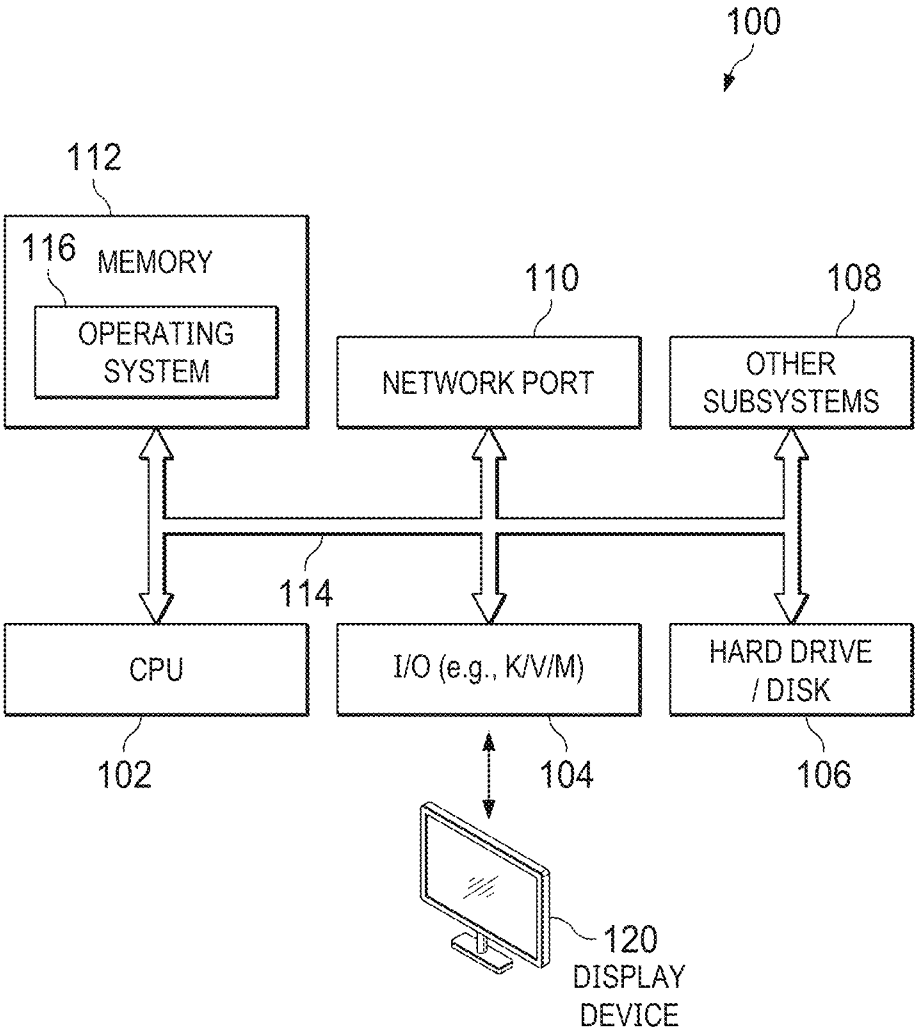
FIG. 1 shows a general illustration of components of an information handling system as implemented in the present disclosure.

Certain aspects of the invention reflect an appreciation that sustainability is a goal that applies to information handling systems and information handling related devices such as display devices. Certain aspects of the present disclosure include an appreciation that sustainability goals can include increasing a percentage of recyclable components contained within various information handling systems and information handling system related devices such as devices.

Certain aspects of the present disclosure include an appreciation that one method of tracking a percentage of recyclable components contained within an information handling system related devices is by measuring a percentage of weight of recyclable materials. Certain aspects of the present disclosure include an appreciation that a goal of a percentage of weight of recyclable materials of approximately 50% of the device weight is desirable.

Certain aspects of the present disclosure include an appreciation that a key contributing component to information handling related devices such as display devices is the cover bottom component of the display device. Certain aspects of the present disclosure include an appreciation that some known display devices include a cover bottom component which extends substantially the entire width and height of the display device. Certain aspects of the present disclosure include an appreciation that some known display devices include a cover bottom system which includes a bottom cover as well as a plurality of separate bottom cover attachment fasteners which physically couple the bottom cover to a middle frame component of the display device. Certain aspects of the present disclosure include an appreciation that some known display devices include a cover bottom component which can weigh between 1700 and 2000 grams. Certain aspects of the present disclosure include an appreciation that some known display devices include a cover bottom component which can include additional weight from the bottom cover attachment fasteners.

Certain aspects of the present disclosure include an appreciation that to maximize recycled ratio and green marketing, it can be desirable to implement the cover bottom component of the display device using recycled steel. Certain aspects of the present disclosure include an appreciation that higher rate recycled steel often cannot maintain the same quality when compared with originally manufactured steel. Certain aspects of the present disclosure include an appreciation that certain recycled steel bottom cover designs can include crack problems, deformation quality problems, or a combination thereof. Certain aspects of the present disclosure include an appreciation that crack problems, deformation quality problems, or a combination thereof can result in light leakage issues, particle discharge issues, or a combination thereof. Accordingly, certain aspects of the present disclosure include an appreciation that it would be desirable to provide a simplified cover bottom component design which is optimized for implementation using recycled material.

Accordingly, a system and method are disclosed for providing an information handling system display device with a simplified bottom cover system design. In various embodiments, the bottom cover system includes a simplified bottom cover constructed from recycled material. In certain embodiments, the bottom cover system implements a simplified flat and partial size cover bottom. In certain embodiments, the simplified flat and partial size cover bottom is implemented without a hook, screw fixing structure.

In certain embodiments, the bottom cover system implements a bottom cover system frame mold which extends substantially around the periphery of the display device housing. In certain embodiments, the bottom cover system frame is implemented to include a magnet insert feature in which magnets may be inserted into the bottom cover frame. In certain embodiments, the frame mold includes a pair of magnet insert features. In certain embodiments, magnets inserted into the bottom cover frame hold the bottom cover flat against the frame mold. In certain embodiments, the magnets replace the hook structure of known bottom covers.

In certain embodiments, the bottom cover system implements an integrated mold frame to provide a simplified structure. In certain embodiments, a mold frame is integrated with a middle frame to provide an integrated mold and middle frame. In certain embodiments, the bottom cover system is implemented to provide a pierced bottom portion which replaces a hook structure of known bottom covers.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In various embodiments, the information handling system 100 is coupled with and communicates with a display device 120. In various embodiments, the information handling system is integrated with the display device to provide an all in one (AIO) type information handling system. In certain embodiments, the information handling system includes a portable information handling system which includes an integrated display device.

In certain embodiments, the display device 120 includes a simplified bottom cover system design. In various embodiments, the bottom cover system includes a simplified bottom cover constructed from recycled material. In certain embodiments, the bottom cover system implements a simplified flat and partial size cover bottom. In certain embodiments, the simplified flat and partial size cover bottom is implemented without a hook, screw fixing structure.

In certain embodiments, the bottom cover system implements a bottom cover system frame mold which extends substantially around the periphery of the display device housing. In certain embodiments, the bottom cover system frame is implemented to include a magnet insert feature in which magnets may be inserted into the bottom cover frame. In certain embodiments, the frame mold includes a pair of magnet insert features. In certain embodiments, magnets inserted into the bottom cover frame hold the bottom cover flat against the frame mold. In certain embodiments, the magnets replace the hook structure of known bottom covers.

In certain embodiments, the bottom cover system implements an integrated mold frame to provide a simplified structure. In certain embodiments, a mold frame is integrated with a middle frame to provide an integrated mold and middle frame. In certain embodiments, the bottom cover system is implemented to provide a pierced bottom portion which replaces a hook structure of known bottom covers.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
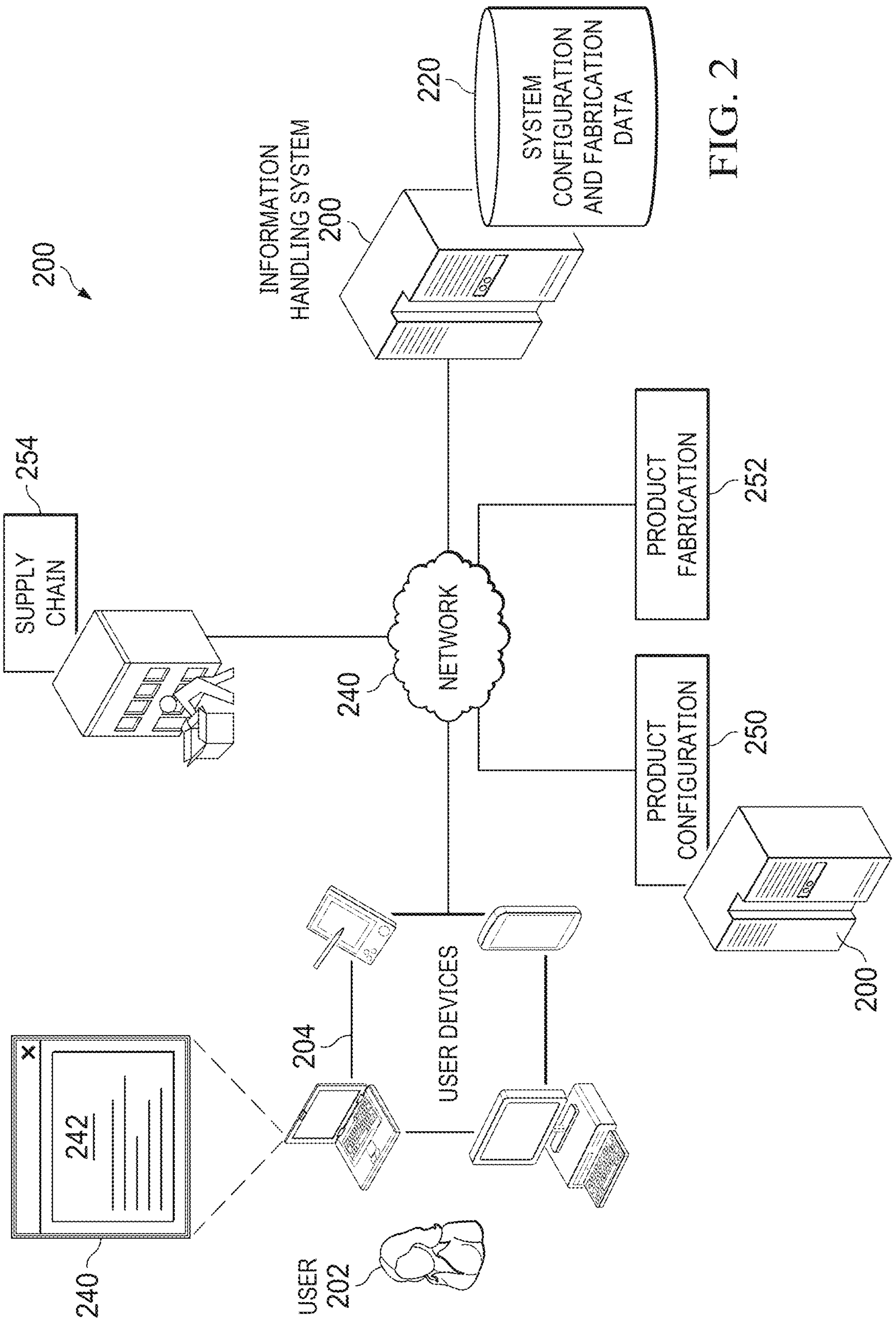
FIG. 2 shows a block diagram of an information handling system configuration and fabrication environment.

FIG. 2 is a block diagram of an information handling system configuration and fabrication environment 200 implemented in accordance with an embodiment of the invention. In certain embodiments, the information handling system configuration and fabrication environment 200 may include a repository of information handling system configuration and fabrication data 220. In certain embodiments, the repository of information handling system configuration and fabrication data 220 may be local or may be executed remotely.

In certain embodiments, the user device 204 is used to exchange information between the user 202 and a product configuration system 250, and a custom product fabrication system 250, through the use of a network 240. In certain embodiments, the network 240 may be a public network, such as a public internet protocol (IP) network, a physical private network, a wireless network, a virtual private network (VPN), or any combination thereof. Skilled practitioners of the art will recognize that many such embodiments are possible and the foregoing is not intended to limit the spirit, scope or intent of the invention. As used herein, a user device 204 refers to an information handling system such as a personal computer, a laptop computer, a tablet computer, a personal digital assistant (PDA), a smart phone, a mobile telephone, or other device that is capable of communicating and processing data. In certain embodiments, the user device 204 may be configured to present a configuration and/or fabrication system user interface (UI) 240. In certain embodiments, the configuration and/or fabrication system UI 240 may be implemented to present a graphical representation 242 of configuration and/or fabrication information.

In various embodiments, the configuration and/or fabrication system UI 240 may be presented via a website. In certain embodiments, the website may be provided by the product configuration system 250. For the purposes of this disclosure a website may be defined as a collection of related web pages which are identified with a common domain name and is published on at least one web server. A website may be accessible via a public IP network or a private local network.

A web page is a document which is accessible via a browser which displays the web page via a display device of an information handling system. In various embodiments, the web page also includes the file which causes the document to be presented via the browser. In various embodiments, the web page may comprise a static web page, which is delivered exactly as stored and a dynamic web page, which is generated by a web application that is driven by software that enhances the web page via user input to a web server.

In certain embodiments, the user device 204 may be implemented to interact with the product configuration system 250, which in turn may be executing on a separate information handling system 200. In various embodiments, the product configuration system 250 interacts with a custom product fabrication system 252. In various embodiments, the custom product fabrication system 252 fabricates products. In various embodiments, the fabricated product includes a display device. In various embodiments, the display device includes a bottom cover system.

Figure 3:
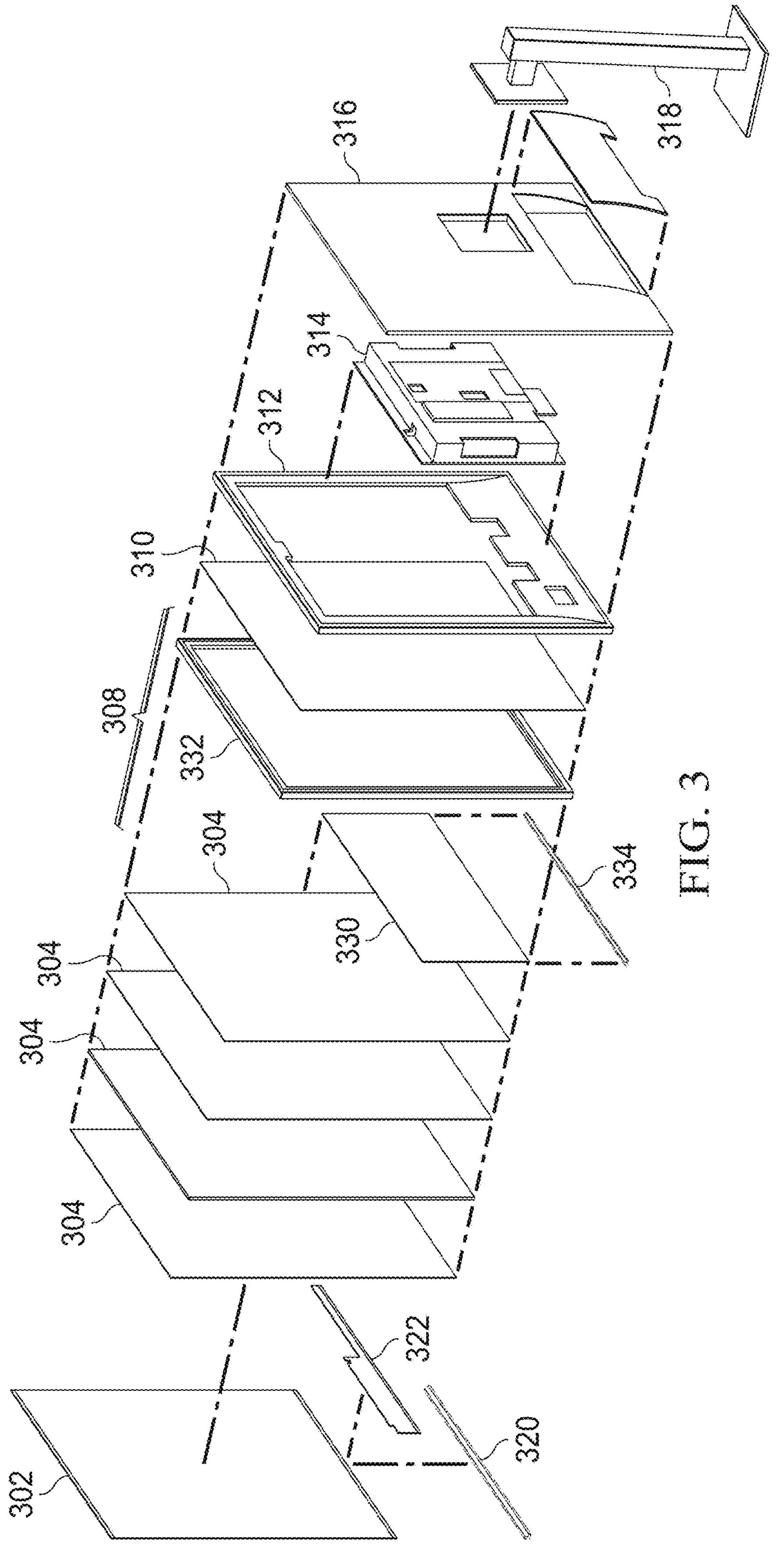
FIG. 3 shows an exploded view of a display device having a plurality of components including a bottom cover system which includes a bottom cover constructed from recycled material.

FIG. 3 shows an exploded view of a display device 300 having a plurality of components including a bottom cover system which includes a bottom cover constructed from recycled material. The display device includes an open-cell LCD component 302, an optical sheets component which includes one or more optical sheets 304, a bottom cover system 308, a light guide panel 310, a support frame 312, a shield component 314 and a rear cover 316. In certain embodiments, the display device 300 also includes a stand 318 which optionally mounts with the rear cover 316. In certain embodiments, the display device 300 further includes a bottom trim portion 320 as well as an open-cell LCD mounting component 322.

In various embodiments, the bottom cover system 308 includes a simplified bottom cover 330 constructed from recycled material. In certain embodiments, the recycled material is available under the trade designation SGCC 0.5t (recycled material 90%). In certain embodiments, the bottom cover system implements a simplified flat and partial size cover bottom. In certain embodiments, the simplified flat and partial size cover bottom is implemented without a hook, screw fixing structure.

In certain embodiments, the bottom cover system 308 implements a bottom cover system frame mold 332 which extends substantially around the periphery of the display device housing. In certain embodiments, the bottom cover system frame 332 is implemented to include a magnet insert feature in which magnets may be inserted into the bottom cover frame. In certain embodiments, the frame mold includes a pair of magnet insert features. In certain embodiments, magnets inserted into the bottom cover frame hold the bottom cover flat against the frame mold. In certain embodiments, the magnets replace the hook structure of known bottom covers.

In certain embodiments, the bottom cover system implements an integrated mold frame to provide a simplified structure. In certain embodiments, a mold frame is integrated with a middle frame to provide an integrated mold and middle frame. In certain embodiments, the bottom cover system is implemented to provide a pierced bottom portion 334 which replaces a hook structure of known bottom covers.

Figure 4:
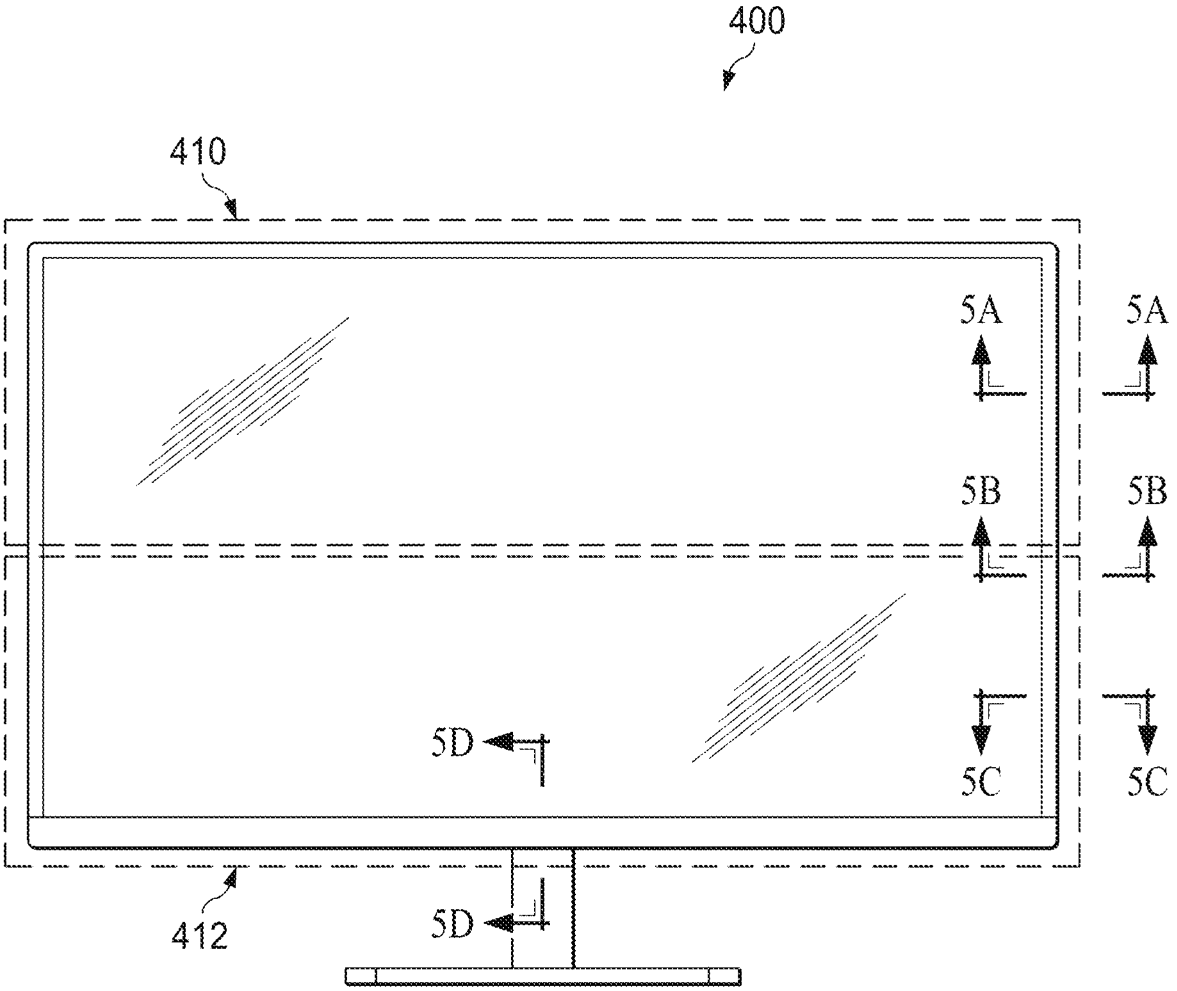
FIG. 4 shows a front view of a display device which includes a bottom cover system which includes a bottom cover constructed from recycled material.
Figure 5A:
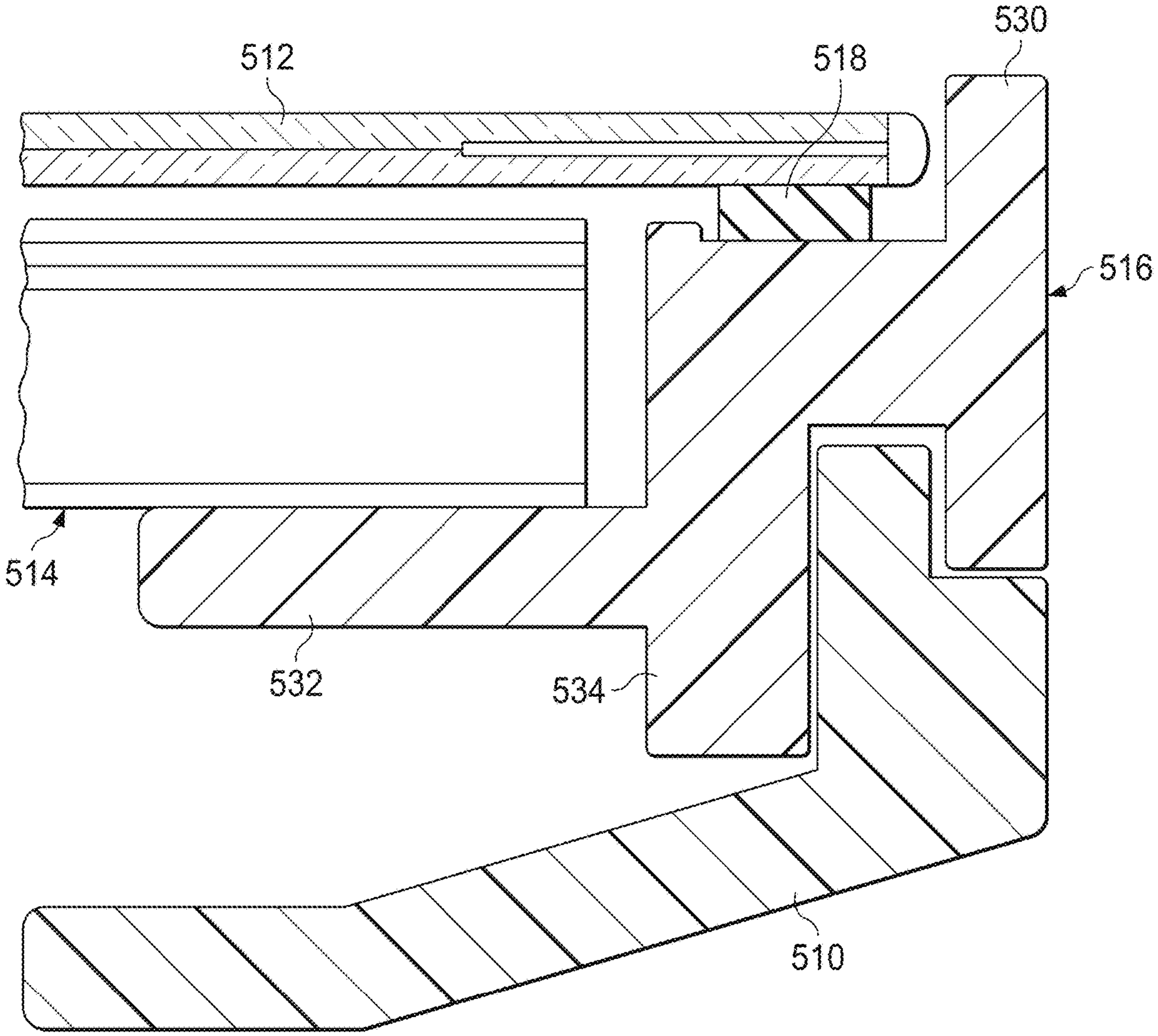
FIGS. 5A, 5B, 5C and 5D, generally referred to as FIG. 5, respectively show views of section 5A, section 5B, section 5C and section 5D of FIG. 4.
Figure 5B:
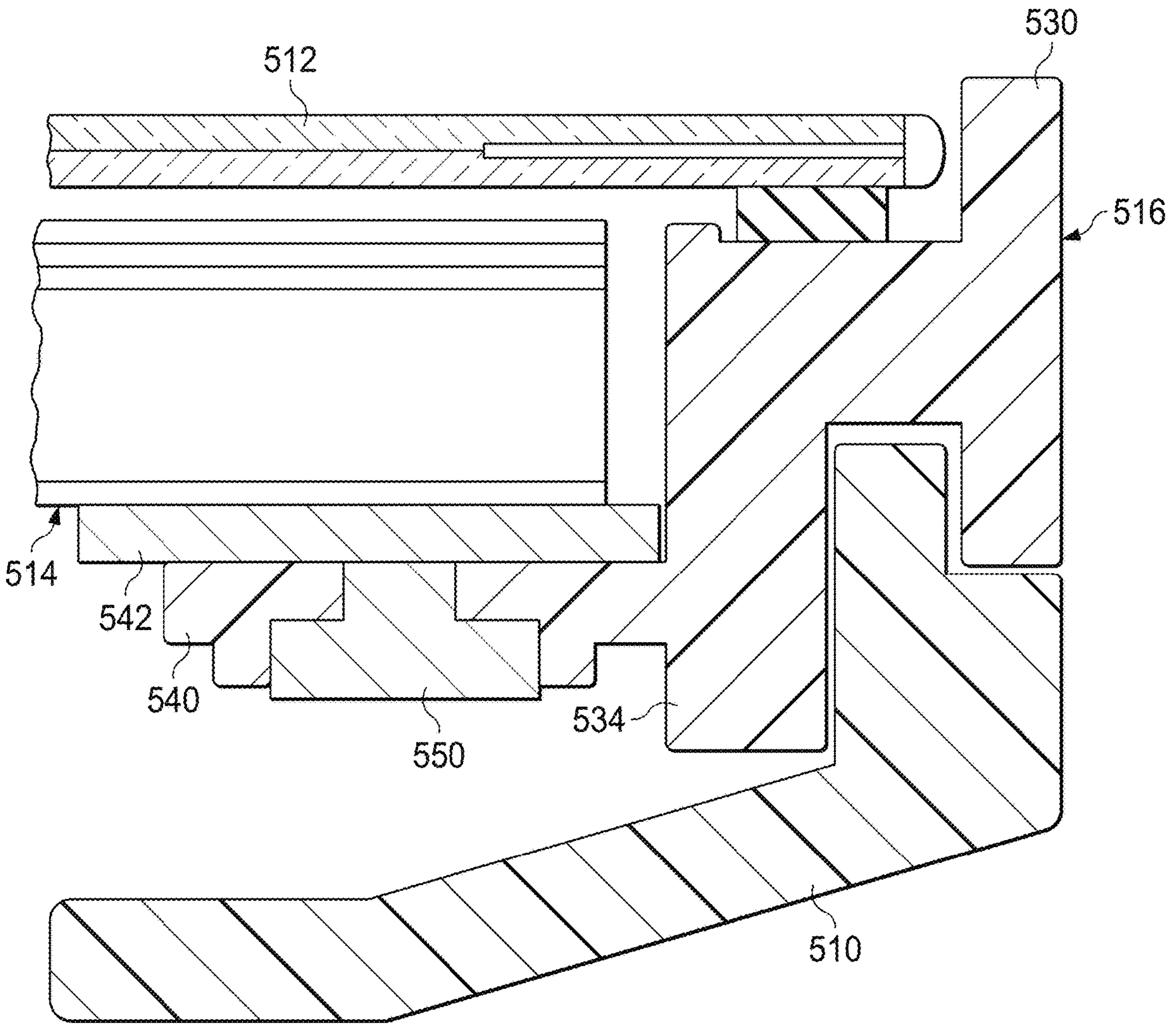

FIG. 4 shows a front view of a display device 400 which includes a bottom cover system which includes a bottom cover constructed from recycled material. FIGS. 5A, 5B, 5C and 5D, generally referred to as FIG. 5, respectively show cut away views of section 5A, section 5B, section 5D and section 5D of FIG. 4. More specifically, FIG. 5A shows a cut away view of a first side portion of the display device 400. FIG. 5B shows a cut away view of a second side portion of the display device 400 in a first direction. FIG. 5D shows a cut away view of a second side portion of the display device 400 in another direction. FIG. 5D shows a cut away view of a bottom portion of the display device 400.

In certain embodiments, the first side portion corresponds to a portion of the display device 400 which does not have a corresponding bottom cover system. In certain embodiments, the second side portion corresponds to a portion of the display device 400 which includes a bottom cover system extending laterally across the display device 400. The display device 400 includes a first substantially (i.e., +/−20%) rectangular display device portion 410 which does not have a corresponding bottom cover system and a second substantially (i.e., +/−20%) rectangular display device portion 412 which includes a bottom cover system extending laterally across the display device 400. In certain embodiments, the first rectangular display device portion 410 has a corresponding first rectangular display device portion area. In certain embodiments, the second rectangular display device portion 412 has a corresponding second rectangular display device portion area. In certain embodiments, the second rectangular display device portion area is less than 50% of the first rectangular display device portion area. In certain embodiments the second rectangular display device portion area corresponds to substantially (i.e., +/−20%) 40% of the first rectangular display device portion area.

Referring now to FIG. 5A, the first side portion of the display device 400 includes a rear frame portion 510, an open cell LCD component 512, an optical sheets component 514 a bottom cover system frame 516 and a system frame mounting component 518. In certain embodiments, the open-cell LCD component 512 and the optical sheets component 514 are examples of display device optical components. In certain embodiments, the bottom cover system frame 516 includes an integrated mold frame. In certain embodiments, the bottom cover system frame 516 is configured to physically mate with the rear frame portion 510. In certain embodiments, the bottom cover system frame includes an exterior edge portion 530, an optical sheets support portion 532 and a bottom cover frame main housing portion 534. In certain embodiments, the bottom cover frame main housing portion 534 is positioned between the exterior edge portion and the optical sheets support portion.

In certain embodiments, the exterior edge portion 530 extends substantially (i.e., +/−20%) perpendicularly to the bottom cover frame main housing portion 534. In certain embodiments, the exterior edge portion 530 extends along a side edge of the outside of the display device 400. In certain embodiments, the exterior edge portion 530 includes an edge which functions as an outside bezel for the display device. In certain embodiments, the outside bezel is configured as a narrow bezel. In certain embodiments, the optical sheets support portion 532 extends substantially (i.e., +/−20%) perpendicularly to the bottom cover frame main housing portion 534. In certain embodiments, the optical sheets support portion 532 extends along a side edge of the inside of display device 400. In certain embodiments, the optical sheets support portion 532 is contiguous with an edge of the optical sheets component 514. In certain embodiments, the optical sheets support portion physically supports a portion of the optical sheets component 514. In certain embodiments, the optical sheets support portion 532 is configured to extend along one or both sides of the rectangular display device portion 410.

Referring now to FIG. 5B, in a first direction the second side portion of the display device 400 includes a rear frame portion 510, an open cell LCD component 512, an optical sheets component 514, a bottom cover system frame 516 and a system frame mounting component 518. In certain embodiments, the bottom cover system frame 516 includes an integrated mold frame. In certain embodiments, the bottom cover system frame 516 is configured to physically mate with the rear frame portion 510. In certain embodiments, the bottom cover system frame includes an exterior edge portion 530, a bottom cover frame main housing portion 534, bottom cover support portion 540. In certain embodiments, the bottom cover support portion 540 is contiguous with a bottom cover component portion 542. In certain embodiments, the exterior edge portion 530 extends substantially (i.e., +/−20%) perpendicularly to the bottom cover frame main housing portion 534. In certain embodiments, the exterior edge portion 530 extends along a side edge of the outside of the display device 400.

In certain embodiments, the bottom cover support portion 540 extends substantially (i.e., +/−20%) perpendicularly to the bottom cover frame main housing portion 534. In certain embodiments, the bottom cover support portion 540 extends along a side edge of the inside of display device 400. In certain embodiments, the bottom cover support portion 540 is contiguous with an edge of the bottom cover component portion 542. In certain embodiment, the bottom cover component portion 542 is contiguous with the optical sheets component 514. In certain embodiments, the bottom cover component portion 542 physically supports a portion of the optical sheets component 514. In certain embodiments, the bottom cover support portion 540 is configured to extend along one or both sides of the rectangular display device portion 412.

In certain embodiments, the bottom cover support portion 540 is implemented to define a magnet insert feature 550 via which a magnet 552 may be inserted into the bottom cover frame. In certain embodiments, the frame mold includes a pair of magnet insert features positioned along opposite sides of the display device 400. In certain embodiments, the magnet 552 is inserted into the magnet insert feature 550 to hold the bottom cover component portion 542 flat against the bottom cover system frame 516. In certain embodiments, the magnet replaces the hook structure of known bottom covers. In certain embodiments, the magnet insert feature 550, the magnet 552, or a combination thereof, provide a bottom cover component fastening device. As used herein, a bottom cover component fastening device broadly refers to one or more design features which work in combination to physically couple a bottom cover system frame and a system frame mounting component.

Figure 5C:
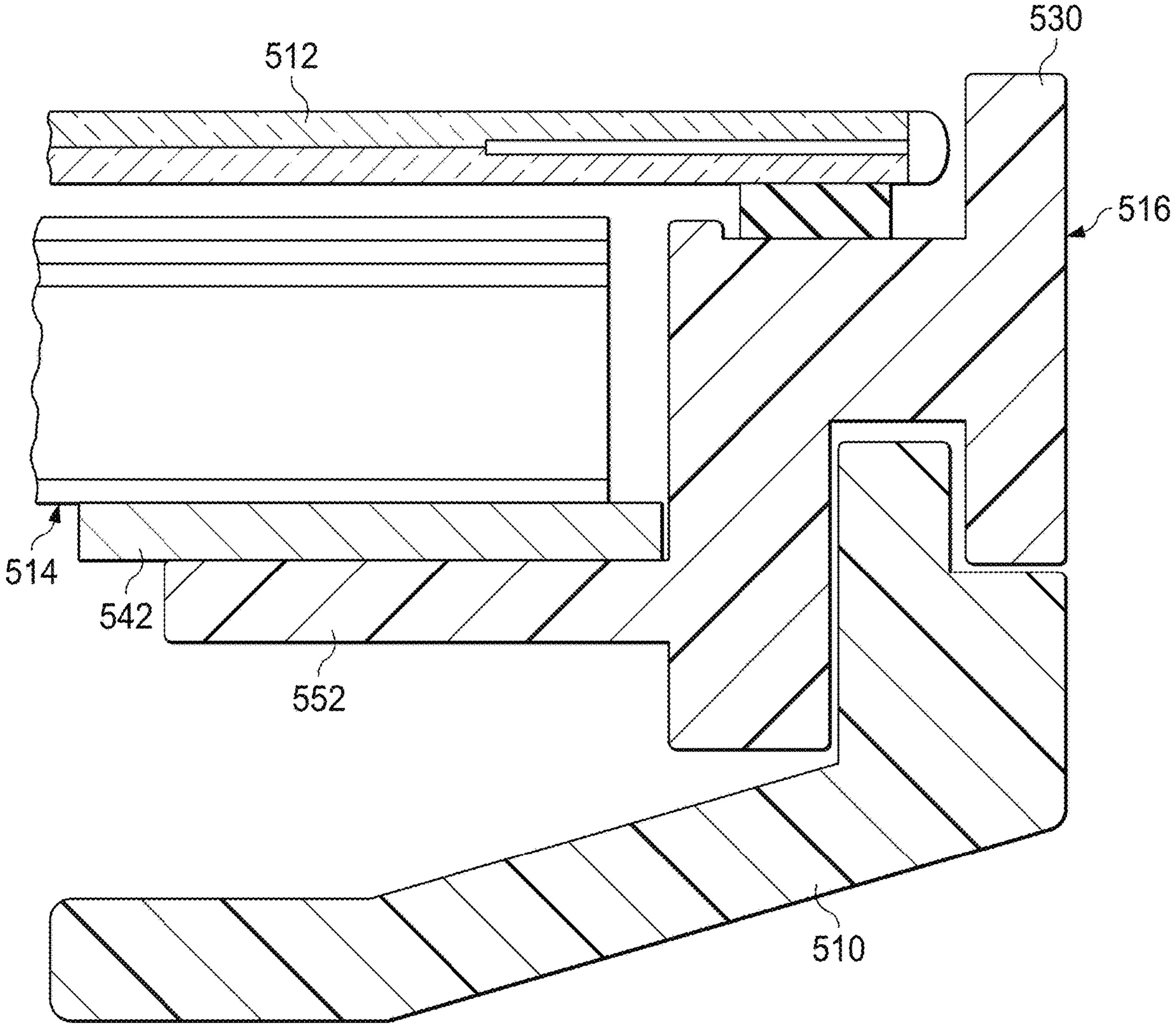
Figure 5D:
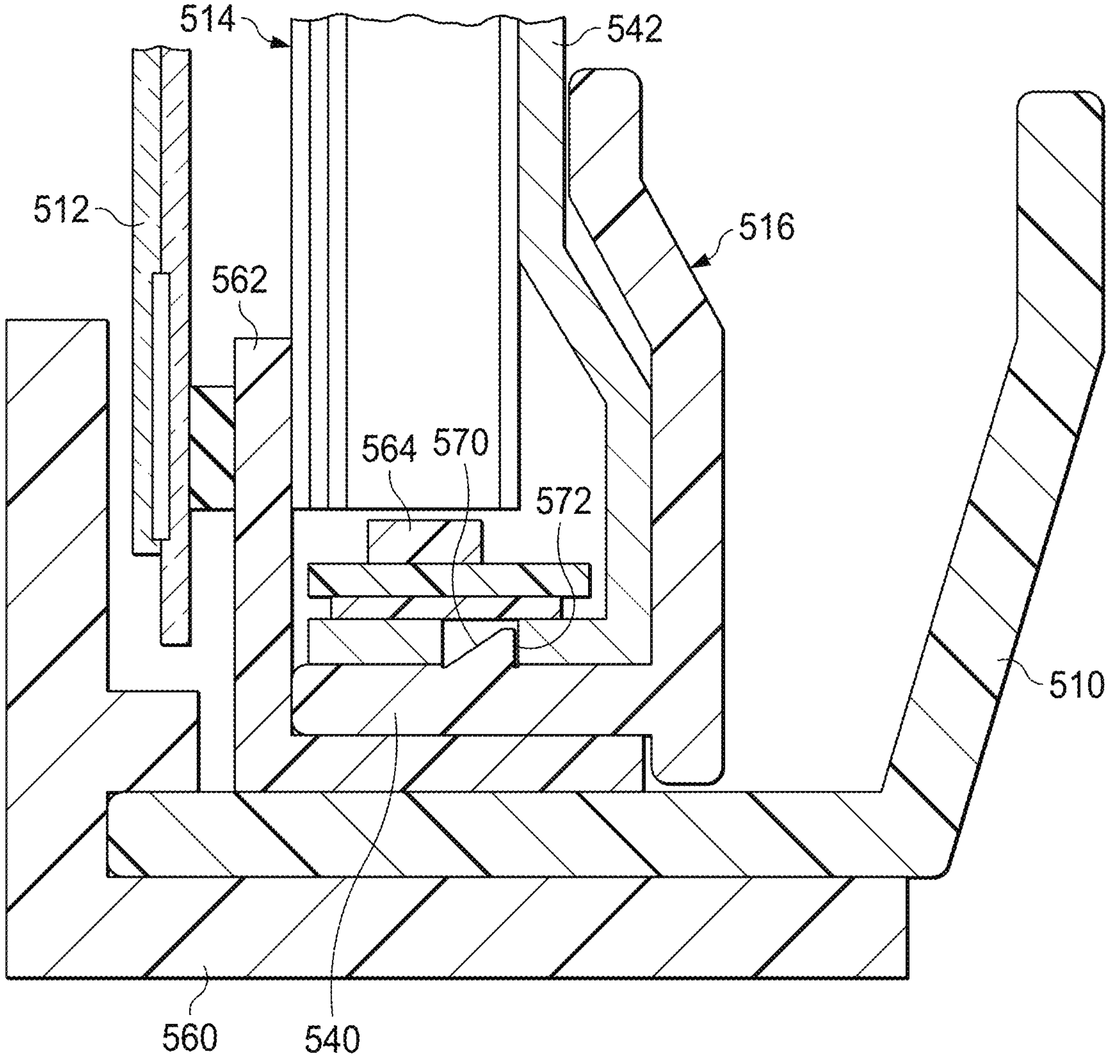

Referring now to FIG. 5C, in another direction, the second side portion of the display device 400 includes a rear frame portion 510, an open cell LCD component 512, an optical sheets component 514, a bottom cover system frame 516 and a system frame mounting component 518. In certain embodiments, the bottom cover system frame 516 includes an integrated mold frame. In certain embodiments, the bottom cover system frame 516 is configured to physically mate with the rear frame portion 510. In certain embodiments, the bottom cover system frame includes an exterior edge portion 530, a bottom cover frame main housing portion 534, bottom cover support portion 552. In certain embodiments, the bottom cover support portion 552 is contiguous with a bottom cover component portion 542.

Referring now to FIG. 5D, the bottom portion of the display device 400 includes a rear frame portion 510, an open cell LCD component 512, an optical sheets component 514, a bottom cover system frame 516 and a system frame mounting component 518. In certain embodiments, the bottom cover system frame 516 includes an integrated mold frame. In certain embodiments, the bottom portion of the display device further includes a bottom trim portion 560, an open-cell mounting component 562, and an optical sheets mounting component 564.

In certain embodiments, the bottom cover system frame 516 is configured to physically mate with the rear frame portion 510. In certain embodiments, the bottom cover system frame includes an exterior edge portion 530, a bottom cover frame main housing portion 534, bottom cover support portion 540 and a bottom cover component portion 542. In certain embodiments, the exterior edge portion 530 extends substantially (i.e., +/−20%) perpendicularly to the bottom cover frame main housing portion 534. In certain embodiments, the exterior edge portion 530 extends along a side edge of the outside of the display device 400.

In certain embodiments, the bottom cover support portion 540 extends substantially (i.e., +/−20%) perpendicularly to the bottom cover frame main housing portion 534. In certain embodiments, the bottom cover support portion 540 extends along a side edge of the inside of display device 400. In certain embodiments, the bottom cover support portion 540 is contiguous with an edge of the bottom cover component portion 542. In certain embodiments, the bottom cover component portion 542 is contiguous with the optical sheets component 514.

In certain embodiments, the bottom cover support portion 540 is implemented to include a top facing projection 570. In certain embodiments, the top facing projection 570 is angled. In certain embodiments, the bottom cover component portion 542 defines an aperture 572. In certain embodiments, the top facing projection 570 of the bottom cover support portion 540 mates with the aperture 572 of the bottom cover component portion 542. In certain embodiments, by so mating, the bottom cover component portion 542 is physically attached to the bottom cover support portion 540. In certain embodiments, the top facing projection 570, the aperture 572, or a combination thereof, provide a bottom cover component fastening device.

Figure 6:
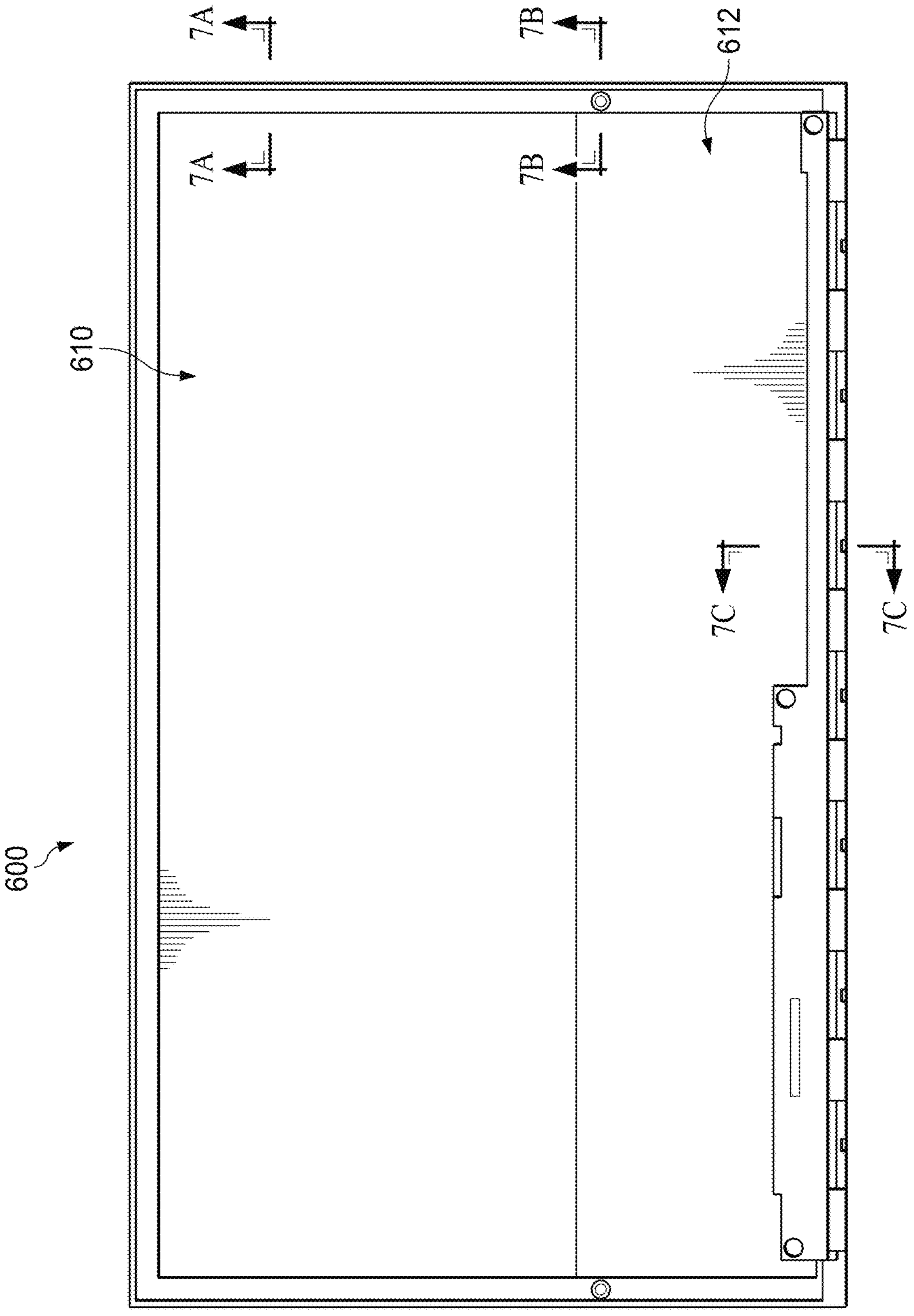
FIG. 6 shows a rear view of a portion of a display device which includes a bottom cover system which includes a bottom cover constructed from recycled material.
Figure 7A:
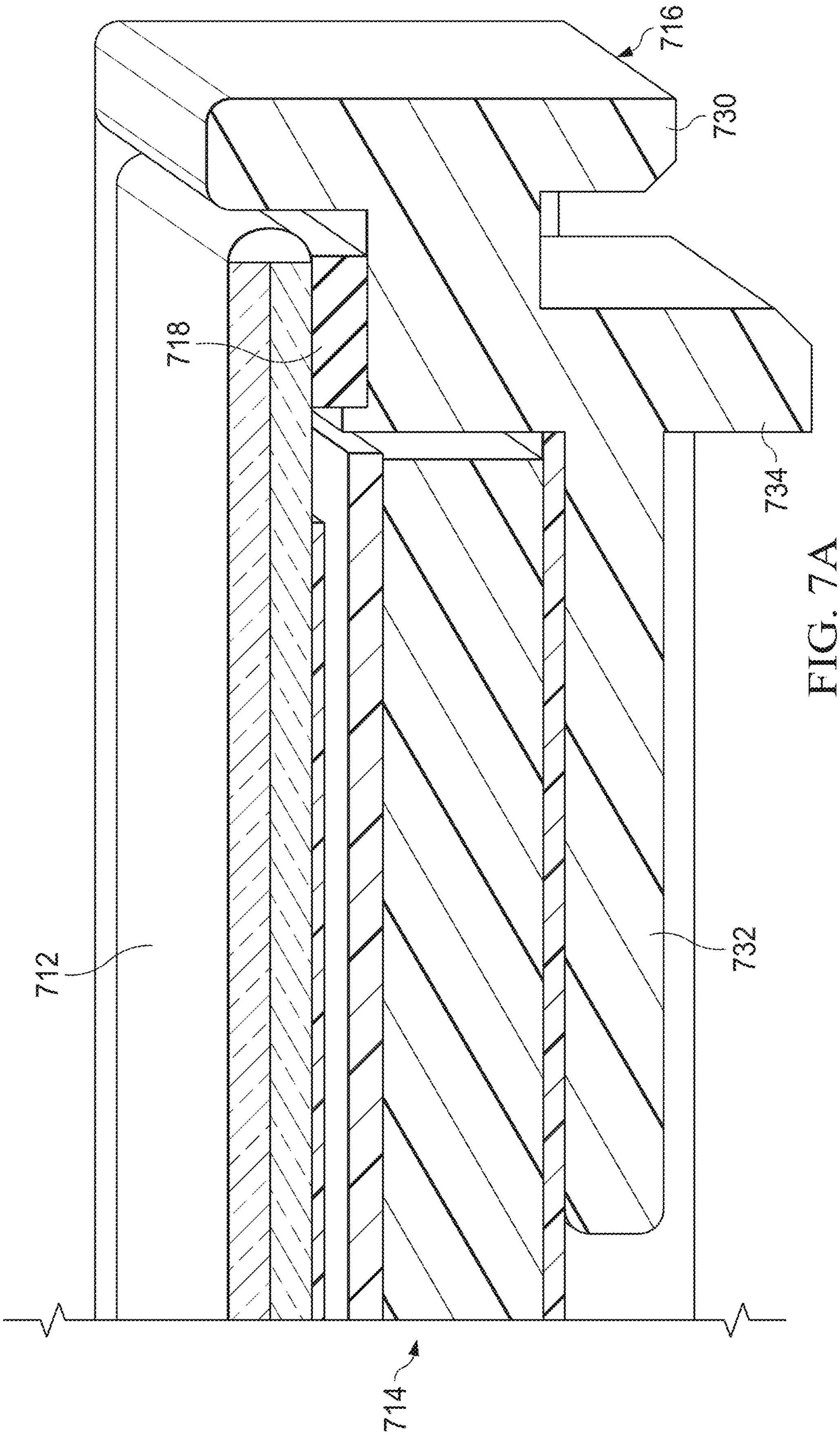
FIGS. 7A, 7B and 7C, generally referred to as FIG. 7, respectively show views of section A, section B and section C of FIG. 6.
Figure 7B:
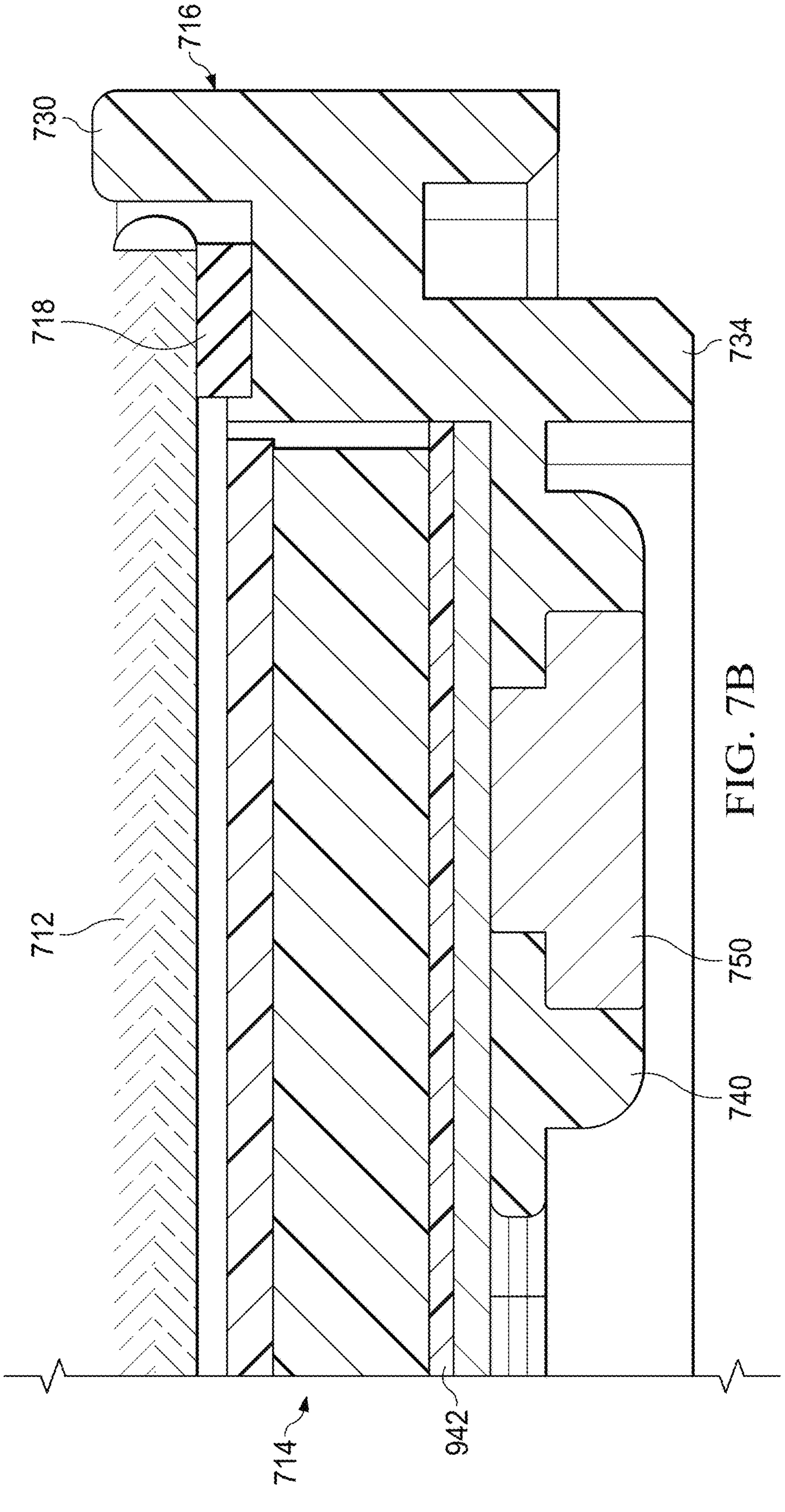
Figure 7C:
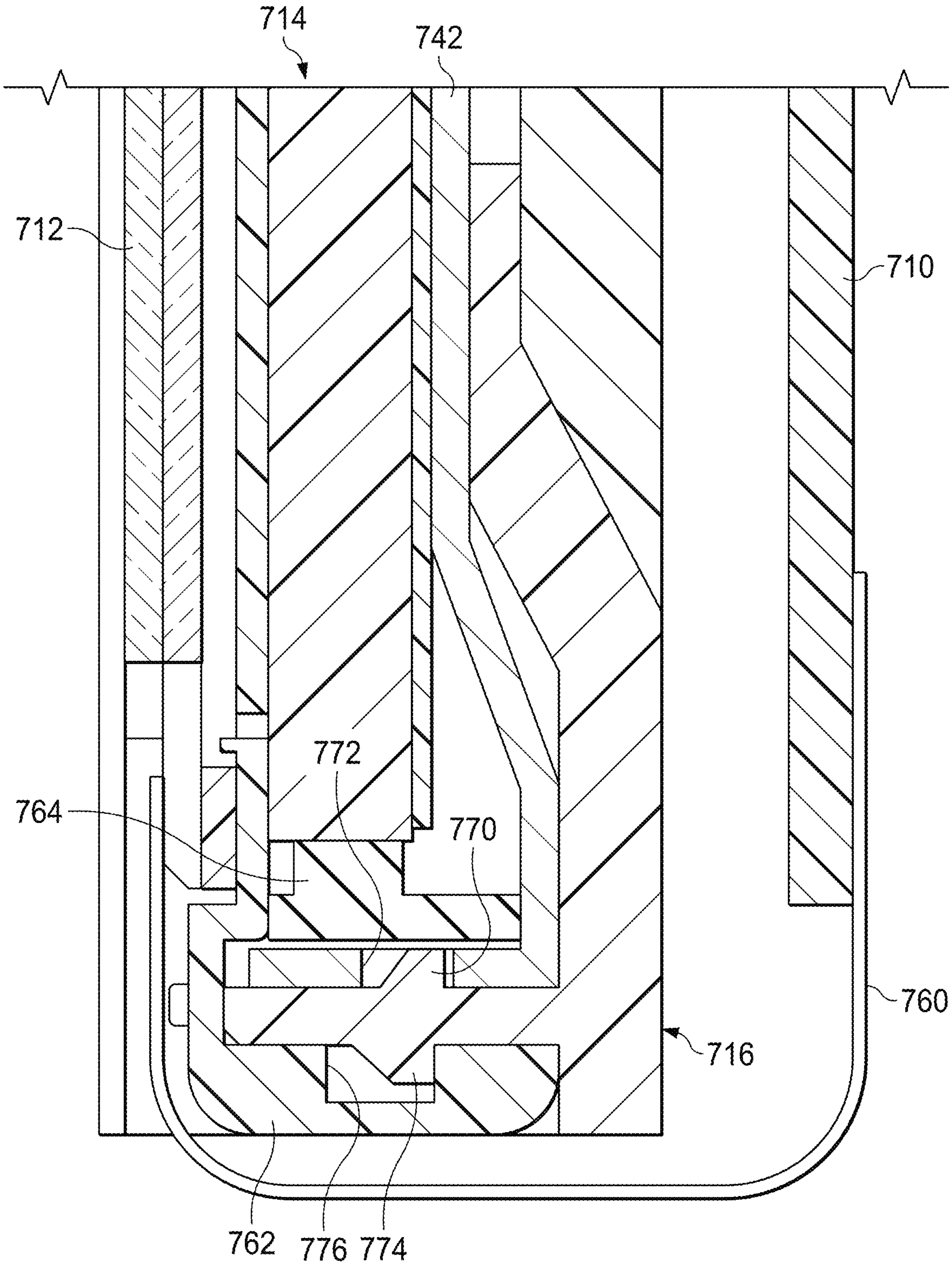

FIG. 6 shows a rear view of a portion of a display device 600 which includes a bottom cover system which includes a bottom cover constructed from recycled material. FIGS. 7A, 7B and 7C, generally referred to as FIG. 7, respectively show cut away views of section 7A, section 7B and section 7C of FIG. 6. More specifically, FIG. 7A shows a cut away view of a first side portion of the display device 600. FIG. 7B shows a cut away view of a second side portion of the display device 600. FIG. 7C shows a cut away view of a bottom portion of the display device 600.

In certain embodiments, the first side portion corresponds to a portion of the display device 600 which does not have a corresponding bottom cover system. In certain embodiments, the second side portion corresponds to a portion of the display device 600 which includes a bottom cover system extending laterally across the display device 600. The display device 600 includes a first substantially (i.e., +/−20%) rectangular display device portion 610 which does not have a corresponding bottom cover system and a second substantially (i.e., +/−20%) rectangular display device portion 612 which includes a bottom cover system extending laterally across the display device 600. In certain embodiments, the first rectangular display device portion 610 has a corresponding first rectangular display device portion area. In certain embodiments, the second rectangular display device portion 612 has a corresponding second rectangular display device portion area. In certain embodiments, the second rectangular display device portion area is less than 70% of the first rectangular display device portion area. In certain embodiments the second rectangular display device portion area corresponds to substantially (i.e., +/−20%) 60% of the first rectangular display device portion area.

Referring now to FIG. 7A, the first side portion of the display device 600 includes a rear frame portion 710, an open cell LCD component 712, an optical sheets component 714 a bottom cover system frame 716 and a system frame mounting component 718. In certain embodiments, the bottom cover system frame 716 includes an integrated mold frame. In certain embodiments, the bottom cover system frame 716 is configured to physically mate with the rear frame portion 710. In certain embodiments, the bottom cover system frame 716 includes an exterior edge portion

730, an optical sheets support portion 732 and a bottom cover frame main housing portion 734. In certain embodiments, the exterior edge portion 730 extends substantially (i.e., +/−20%) perpendicularly to the bottom cover frame main housing portion 734. In certain embodiments, the exterior edge portion 730 extends along a side edge of the outside of the display device 600. In certain embodiments, the optical sheets support portion 732 extends substantially (i.e., +/−20%) perpendicularly to the bottom cover frame main housing portion 734. In certain embodiments, the optical sheets support portion 732 extends along a side edge of the inside of display device 600. In certain embodiments, the optical sheets support portion 732 is contiguous with an edge of the optical sheets component 714.

Referring now to FIG. 7B, the second side portion of the display device 600 includes a rear frame portion 710, an open cell LCD component 712, an optical sheets component 714 a bottom cover system frame 716 and a system frame mounting component 718. In certain embodiments, the bottom cover system frame 716 includes an integrated mold frame. In certain embodiments, the bottom cover system frame 716 is configured to physically mate with the rear frame portion 710. In certain embodiments, the bottom cover system frame includes an exterior edge portion 730, a bottom cover frame main housing portion 734, bottom cover support portion 740 and a bottom cover component portion 742. In certain embodiments, the exterior edge portion 730 extends substantially (i.e., +/−20%) perpendicularly to the bottom cover frame main housing portion 734. In certain embodiments, the exterior edge portion 730 extends along a side edge of the outside of the display device 600.

In certain embodiments, the bottom cover support portion 740 extends substantially (i.e., +/−20%) perpendicularly to the bottom cover frame main housing portion 734. In certain embodiments, the bottom cover support portion 740 extends along a side edge of the inside of display device 600. In certain embodiments, the bottom cover support portion 740 is contiguous with an edge of the bottom cover component portion 742. In certain embodiments, the bottom cover component portion 742 is contiguous with the optical sheets component 714.

In certain embodiments, the bottom cover support portion 740 is implemented to define a magnet insert feature 750 via which a magnet 752 may be inserted into the bottom cover frame. In certain embodiments, the frame mold includes a pair of magnet insert features positioned along opposite sides of the display device 600. In certain embodiments, the magnet 752 is inserted into the bottom cover support portion 740 to hold the bottom cover component portion 742 flat against the bottom cover system frame 716. In certain embodiments, the magnet replaces the hook structure of known bottom covers.

Referring now to FIG. 7C, the bottom portion of the display device 600 includes a rear frame portion 710, an open cell LCD component 712, an optical sheets component 714, a bottom cover system frame 716 and a system frame mounting component 718. In certain embodiments, the bottom cover system frame 716 includes an integrated mold frame. In certain embodiments, the bottom portion of the display device further includes a bottom trim portion 760, an open-cell mounting component 762, and an optical sheets mounting component 764.

In certain embodiments, the bottom cover system frame 716 is configured to physically mate with the rear frame portion 710. In certain embodiments, the bottom cover system frame includes an exterior edge portion 730, a bottom cover frame main housing portion 734, bottom cover support portion 740 and a bottom cover component portion 742. In certain embodiments, the exterior edge portion 730 extends substantially (i.e., +/−20%) perpendicularly to the bottom cover frame main housing portion 734. In certain embodiments, the exterior edge portion 730 extends along a side edge of the outside of the display device 600.

In certain embodiments, the bottom cover support portion 740 extends substantially (i.e., +/−20%) perpendicularly to the bottom cover frame main housing portion 734. In certain embodiments, the bottom cover support portion 740 extends along a side edge of the inside of display device 600. In certain embodiments, the bottom cover support portion 740 is contiguous with an edge of the bottom cover component portion 742. In certain embodiments, the bottom cover component portion 742 is contiguous with the optical sheets component 714.

In certain embodiments, the bottom cover support portion 740 is implemented to include a top facing projection 770. In certain embodiments, the top facing projection 770 is angled. In certain embodiments, the bottom cover component portion 742 defines an aperture 772. In certain embodiments, the top facing projection 770 of the bottom cover support portion 740 mates with the aperture 772 of the bottom cover component portion 742. In certain embodiments, by so mating, the bottom cover component portion 742 is physically attached to the bottom cover support portion 740. In certain embodiments, the top facing projection 770, the aperture 772, or a combination thereof, provide a bottom cover component fastening device.

In certain embodiments, the bottom cover support portion 740 is implemented to include a bottom facing projection 774. In certain embodiments, the bottom facing projection 774 is angled. In certain embodiments, the open-cell mounting component 762 defines a recess 776. In certain embodiments, the bottom facing projection 772 of the bottom cover support portion 740 mates with the recess 776 of the open-cell mounting component 762. In certain embodiments, by so mating, the bottom cover component portion 742 is physically attached to the open-cell mounting component 762. In certain embodiments, the bottom facing projection 774, the recess 776, or a combination thereof, provide a mounting component fastening device. As used herein, a mounting component fastening device broadly refers to one or more design features which work in combination to physically couple a bottom cover system frame and a mounting component for mounting an optical component. In certain embodiments, the mounting component includes an open-cell mounting component.

Figure 8:
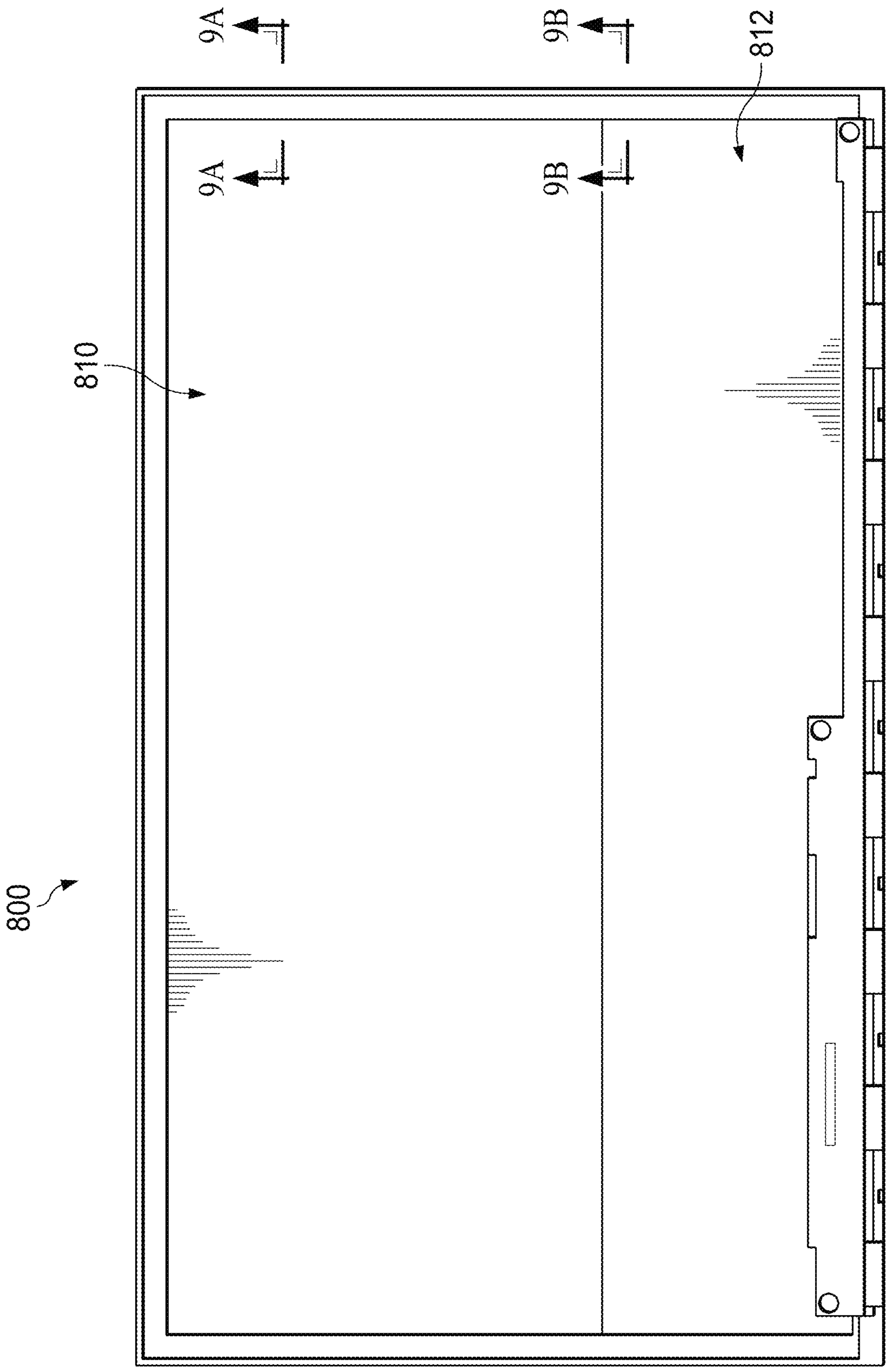
FIG. 8 shows a rear view of a portion of an alternate display device which includes a bottom cover system which includes a bottom cover constructed from recycled material.
Figure 9A:
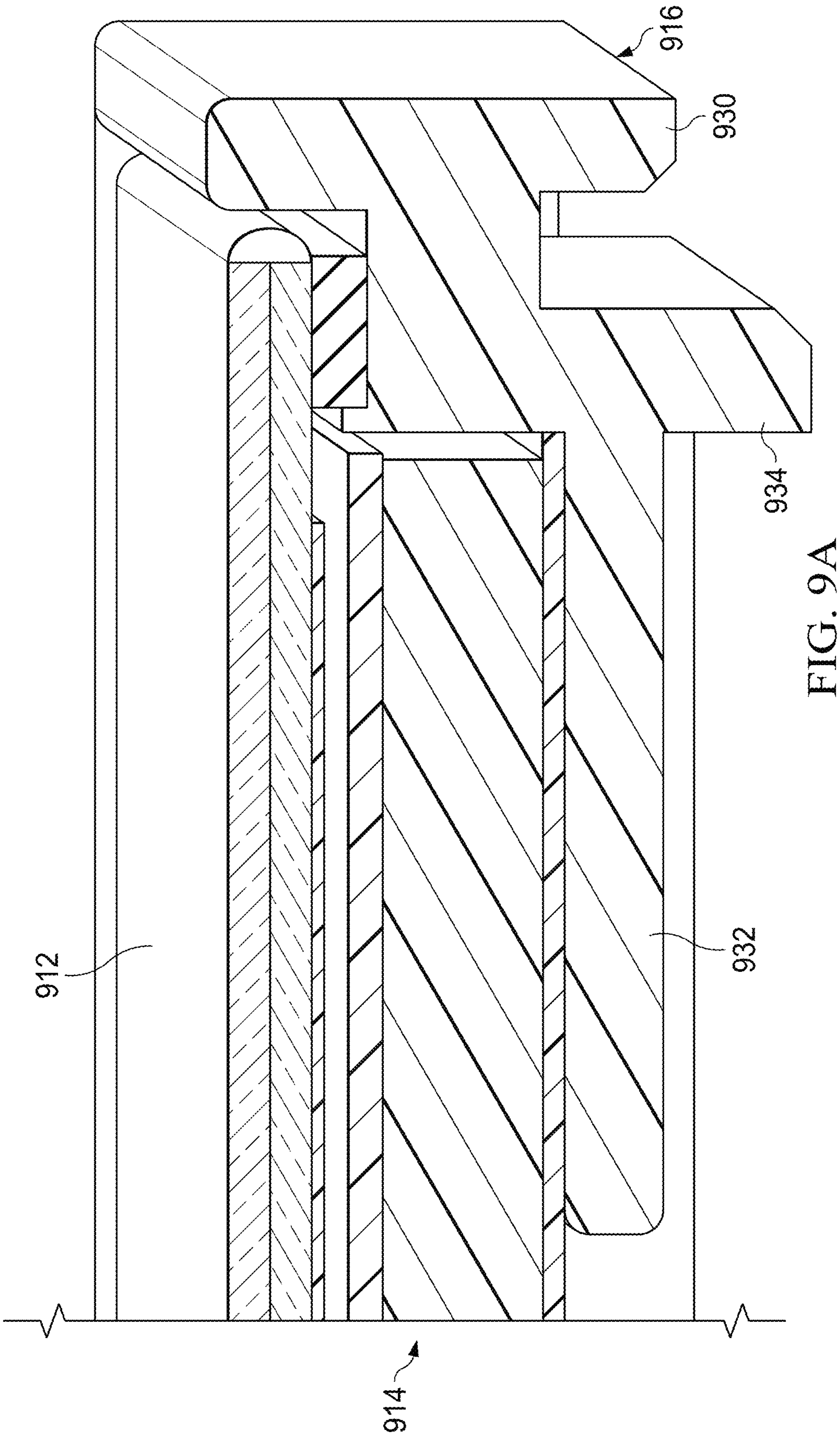
FIGS. 9A and 9B, generally referred to as FIG. 9, respectively show views of section 9A and section 9B of FIG. 8.
Figure 9B:
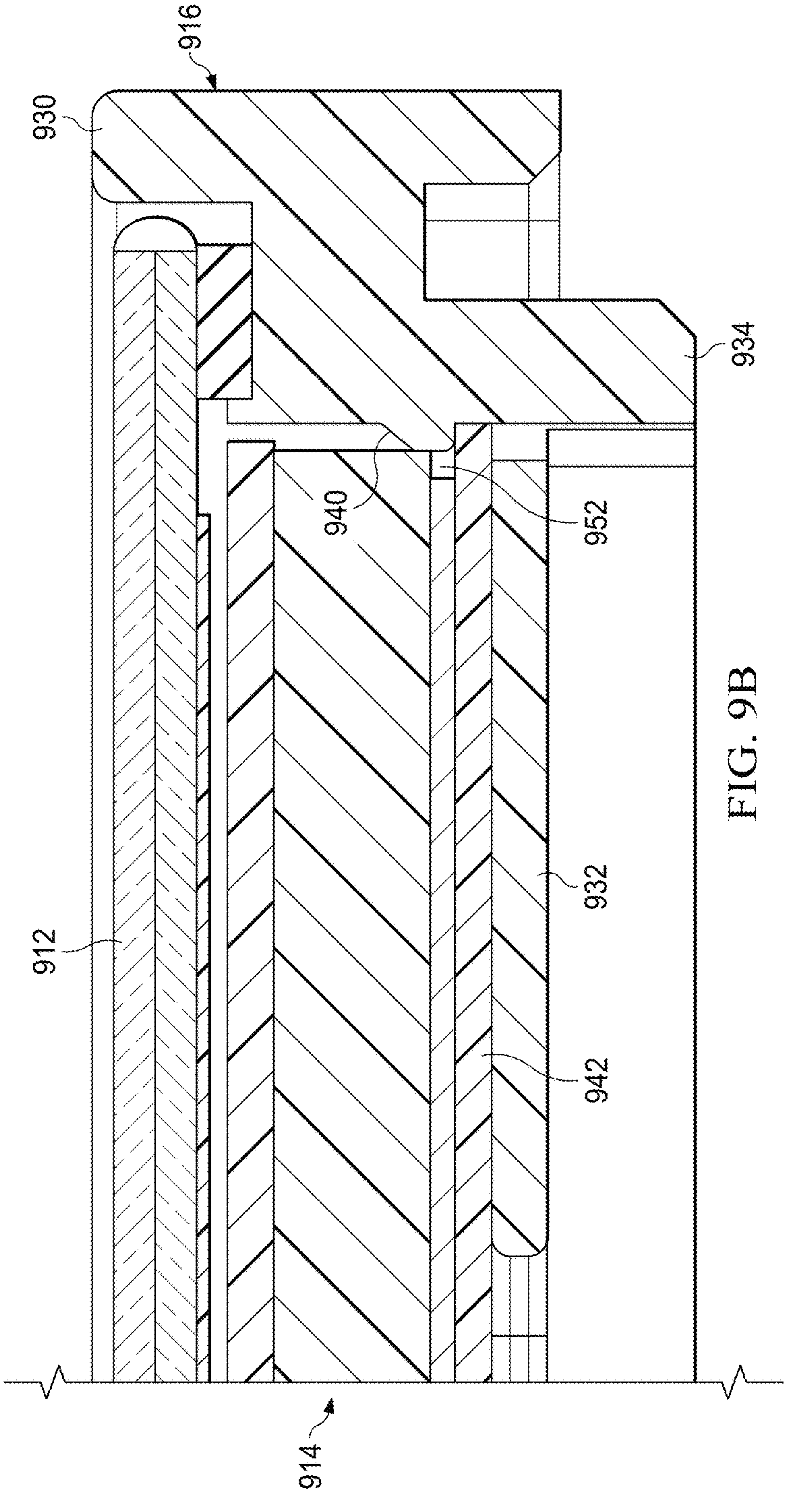
Figure 9C:
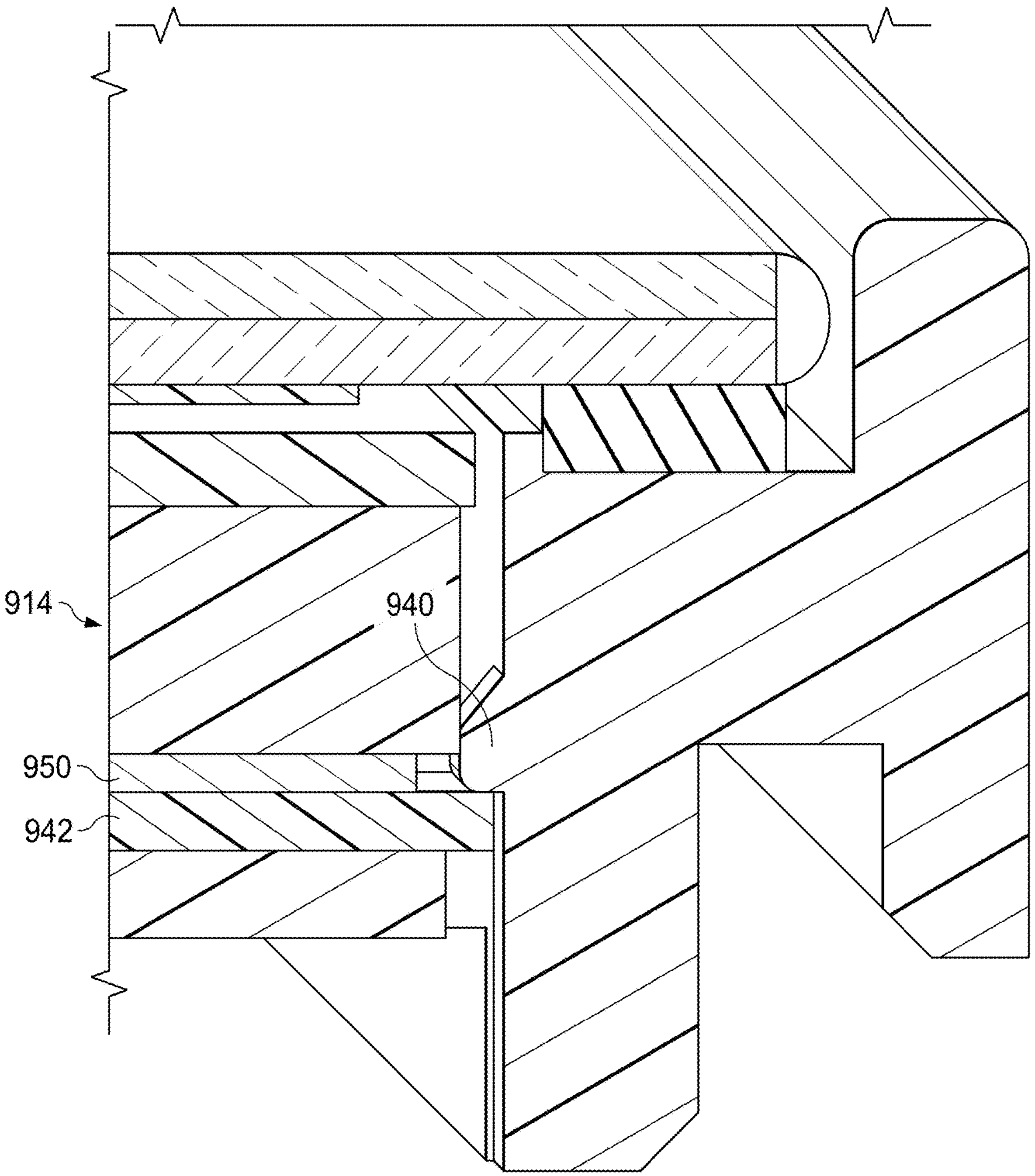
FIGS. 9C and 9D, generally referred to as FIG. 9, show respective perspective views of section 9B.

FIG. 8 shows a rear view of a portion of an alternate display device which includes a bottom cover system which includes a bottom cover constructed from recycled material. FIGS. 9A and 9B, generally referred to as FIG. 9, respectively show views of section 9A and section 9B of FIG. 8. FIGS. 9C and 9B, generally referred to as FIG. 9, show respective perspective views of section 9B.

In certain embodiments, the first side portion corresponds to a portion of the display device 800 which does not have a corresponding bottom cover system. In certain embodiments, the second side portion corresponds to a portion of the display device 800 which includes a bottom cover system extending laterally across the display device 800. The display device 800 includes a first substantially (i.e., +/−20%) rectangular display device portion 810 which does not have a corresponding bottom cover system and a second substantially (i.e., +/−20%) rectangular display device portion 812 which includes a bottom cover system extending laterally across the display device 800. In certain embodiments, the first rectangular display device portion 810 has a corresponding first rectangular display device portion area. In certain embodiments, the second rectangular display device portion 812 has a corresponding second rectangular display device portion area. In certain embodiments, the second rectangular display device portion area is less than 90% of the first rectangular display device portion area. In certain embodiments the second rectangular display device portion area corresponds to substantially (i.e., +/−20%) 80% of the first rectangular display device portion area.

Referring now to FIG. 9A, the first side portion of the display device 800 includes a rear frame portion 910, an open cell LCD component 912, an optical sheets component 914, a bottom cover system frame 916 and a system frame mounting component 918. In certain embodiments, the bottom cover system frame 916 includes an integrated mold frame. In certain embodiments, the bottom cover system frame 916 is configured to physically mate with the rear frame portion 910. In certain embodiments, the bottom cover system frame 916 includes an exterior edge portion 930, an optical sheets support portion 932 and a bottom cover frame main housing portion 934. In certain embodiments, the exterior edge portion 930 extends substantially (i.e., +/−20%) perpendicularly to the bottom cover frame main housing portion 934. In certain embodiments, the exterior edge portion 930 extends along a side edge of the outside of the display device 800. In certain embodiments, the optical sheets support portion 932 extends substantially (i.e., +/−20%) perpendicularly to the bottom cover frame main housing portion 934. In certain embodiments, the optical sheets support portion 932 extends along a side edge of the inside of display device 800. In certain embodiments, the optical sheets support portion 932 is contiguous with an edge of the optical sheets component 914.

Figure 9D:
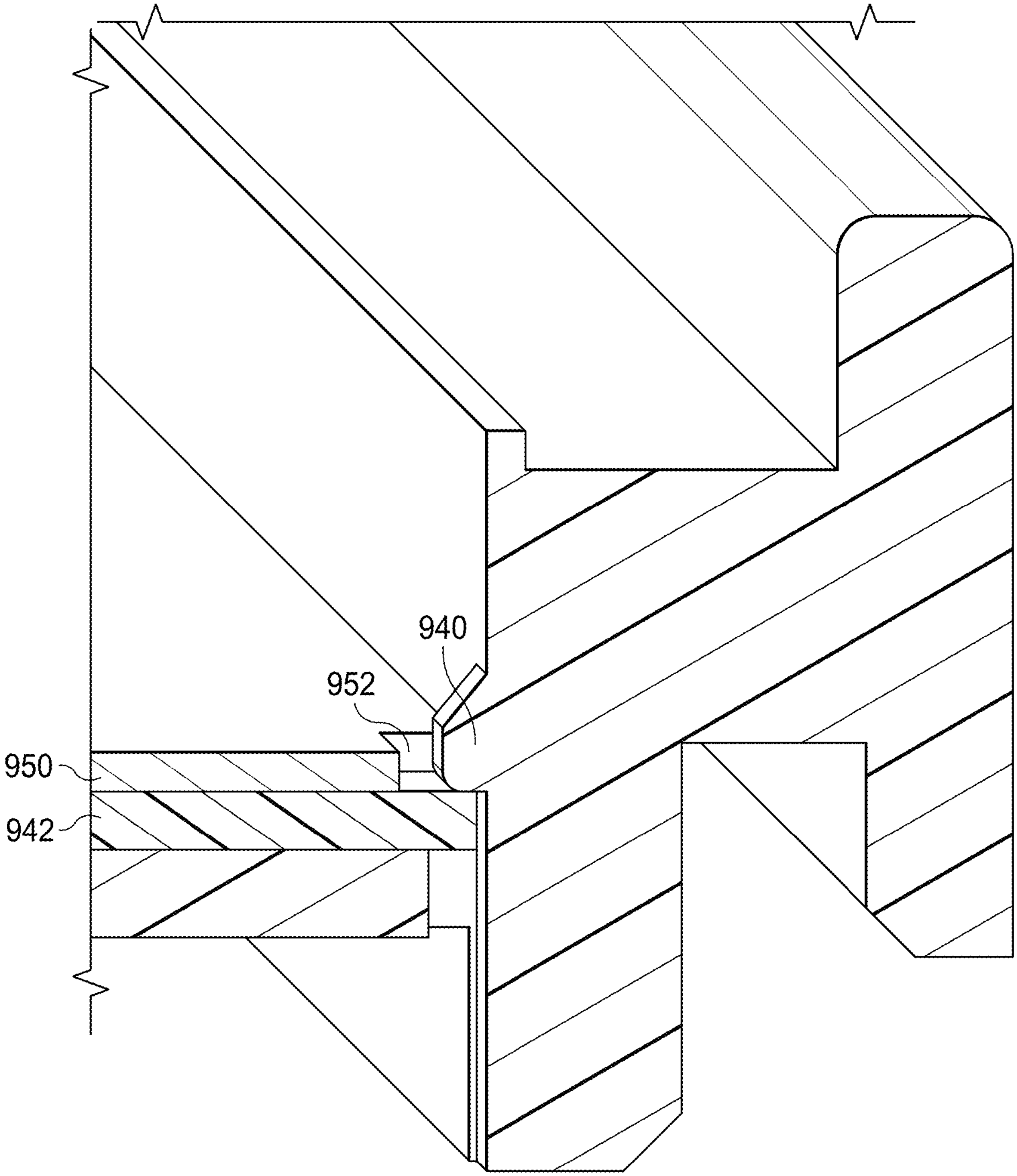

Referring now to FIGS. 9B, 9C and 9D, the second side portion of the display device 800 includes a rear frame portion 910, an open cell LCD component 912, an optical sheets component 914 a bottom cover system frame 916 and a system frame mounting component 918. In certain embodiments, the bottom cover system frame 916 includes an integrated mold frame. In certain embodiments, the bottom cover system frame 916 is configured to physically mate with the rear frame portion 910. In certain embodiments, the bottom cover system frame includes an exterior edge portion 930, a bottom cover frame main housing portion 934, bottom cover support portion 940 and a bottom cover component portion 942. In certain embodiments, the exterior edge portion 930 extends substantially (i.e., +/−20%) perpendicularly to the bottom cover frame main housing portion 934. In certain embodiments, the exterior edge portion 930 extends along a side edge of the outside of the display device 800.

In certain embodiments, the bottom cover support portion 940 extends substantially (i.e., +/−20%) perpendicularly to the bottom cover frame main housing portion 934. In certain embodiments, the bottom cover support portion 940 extends along a side edge of the inside of display device 800. In certain embodiments, the bottom cover support portion 940 is contiguous with an edge of the bottom cover component portion 942. In certain embodiments, the bottom cover component portion 942 is contiguous with the optical sheets component 914.

In certain embodiments, the bottom cover system frame 916 includes a mounting projection 940. In certain embodiments, the bottom cover frame main housing portion 934 of the bottom cover system frame 916 includes the mounting projection 940. In certain embodiments, the mounting projection 940 includes an edge that is contiguous with the bottom cover component portion 942. In certain embodiments, the edge is contiguous with an edge of the bottom cover component portion 942. In certain embodiments, the projection 942 is configured as a rib. In certain embodiments, each side of the bottom cover system frame includes a respective projection 942. In certain embodiments, the projection 942 replaces the hook structure of known bottom covers. In certain embodiments, the projection 942 provides a bottom cover component fastening device.

In certain embodiments, one or more optical devices define a notch 952 which mates with the projection 942. In certain embodiments, the one or more optical devices include a sheet 952 of the optical sheets component 914. In certain embodiments, the sheet 952 includes a reflector sheet of the optical sheets component 914.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A bottom cover system for a display device comprising:

a bottom cover system frame, the bottom cover system frame being configured to extend substantially around a periphery of the display device, the bottom cover system frame defining a magnet insert feature extending through the bottom cover system frame; and a bottom cover component, the bottom cover component being physically coupled to the bottom cover system frame via a bottom cover component fastening device, the bottom cover fastening device comprising a magnet mounted on the bottom cover system frame via the magnet insert feature, the magnet physically coupling the bottom cover component to the bottom cover system frame, the bottom cover component having a rectangular bottom cover component area, the rectangular bottom cover area being less than an area of a rectangular area of the display device.

2. The bottom cover system of claim 1, wherein:

the magnet mounted on the bottom cover system frame includes a first portion and a second portion, the first portion being wider than the second portion, the first portion of the magnet holding the magnet within the magnet insert feature, the second portion of the magnet physically coupling the bottom cover component to the bottom cover system frame.

3. The bottom cover system of claim 1, wherein:

the bottom cover system frame comprises an exterior edge portion, an optical sheets support portion and a main housing portion positioned between the exterior edge portion and the optical sheets portion.

4. The bottom cover system of claim 3, wherein:

the optical sheets support portion is configured to extend along a side of a rectangular display device portion.

5. The bottom cover system of claim 4, wherein:

the bottom cover system frame further comprises a bottom cover support portion, the bottom cover support portion being configured to extend along a side of the rectangular bottom cover component area.

6. A display device comprising:

a display component; and, a bottom cover system, the bottom cover system comprising a bottom cover system frame, the bottom cover system frame being configured to extend substantially around a periphery of the display device, the bottom cover system frame defining a magnet insert feature extending through the bottom cover system frame; and bottom cover component, the bottom cover component being physically coupled to the bottom cover system frame via a bottom cover component fastening device, the bottom cover fastening device comprising a magnet mounted on the bottom cover system frame via the magnet insert feature, the magnet physically coupling the bottom cover component to the bottom cover system frame, the bottom cover component having a rectangular bottom cover component area, the rectangular bottom cover area being less than an area of a rectangular area of the display device.

7. The display device of claim 6, wherein:

the magnet mounted on the bottom cover system frame includes a first portion and a second portion, the first portion being wider than the second portion, the first portion of the magnet holding the magnet within the magnet insert feature, the second portion of the magnet physically coupling the bottom cover component to the bottom cover system frame.

8. The display device of claim 6, wherein:

the bottom cover system frame comprises an exterior edge portion, an optical sheets support portion and a main housing portion positioned between the exterior edge portion and the optical sheets portion.

9. The display device of claim 8, wherein:

the optical sheets support portion is configured to extend along a side of a rectangular display device portion.

10. The display device of claim 9, wherein:

the bottom cover system frame further comprises a bottom cover support portion, the bottom cover support portion being configured to extend along a side of the rectangular bottom cover component area.

11. A system comprising:

a processor;

a data bus coupled to the processor; and a display device, the display device comprising a display component; and, a bottom cover system, the bottom cover system comprising a bottom cover system frame, the bottom cover system frame being configured to extend substantially around a periphery of the display device, the bottom cover system frame defining a magnet insert feature extending through the bottom cover system frame; and bottom cover component, the bottom cover component being physically coupled to the bottom cover system frame via a bottom cover component fastening device, the bottom cover fastening device comprising a magnet mounted on the bottom cover system frame via the magnet insert feature, the magnet physically coupling the bottom cover component to the bottom cover system frame, the bottom cover component having a rectangular bottom cover component area, the rectangular bottom cover area being less than an area of a rectangular area of the display device.

12. The system of claim 11, wherein:

the magnet mounted on the bottom cover system frame includes a first portion and a second portion, the first portion being wider than the second portion, the first portion of the magnet holding the magnet within the magnet insert feature, the second portion of the magnet physically coupling the bottom cover component to the bottom cover system frame.

13. The system of claim 11, wherein:

the bottom cover system frame comprises an exterior edge portion, an optical sheets support portion and a main housing portion positioned between the exterior edge portion and the optical sheets portion.

14. The system of claim 13, wherein:

the optical sheets support portion is configured to extend along a side of a rectangular display device portion.

15. The system of claim 14, wherein:

the bottom cover system frame further comprises a bottom cover support portion, the bottom cover support portion being configured to extend along a side of the rectangular bottom cover component area.

* * * * *